US007002415B2

(12) United States Patent
Tsyrganovich

(10) Patent No.: US 7,002,415 B2
(45) Date of Patent: Feb. 21, 2006

(54) FREQUENCY LOCKED LOOP

(75) Inventor: Anatoliy V. Tsyrganovich, San Jose, CA (US)

(73) Assignee: ZiLOG, Inc., San Jose, CA (US)

( * ) Notice: Subject to any disclaimer, the term of this patent is extended or adjusted under 35 U.S.C. 154(b) by 136 days.

(21) Appl. No.: 10/690,874

(22) Filed: Oct. 21, 2003

(65) Prior Publication Data

US 2004/0090277 A1    May 13, 2004

Related U.S. Application Data

(63) Continuation-in-part of application No. 09/973,979, filed on Oct. 9, 2001, now Pat. No. 6,636,122.

(51) Int. Cl.
*H03L 7/00* (2006.01)
(52) U.S. Cl. .................. 331/1 R; 331/18; 327/156; 327/162
(58) Field of Classification Search ............. 331/1 R, 331/1 A, 18, 25, DIG. 2; 375/373, 375, 375/376; 327/105, 116, 119, 141, 144, 145, 327/147, 156, 160, 162
See application file for complete search history.

(56) References Cited

U.S. PATENT DOCUMENTS

| 4,093,997 | A | * | 6/1978 | Germer ...................... 713/501 |
| 5,638,010 | A | * | 6/1997 | Adams ....................... 327/105 |
| 5,757,238 | A | * | 5/1998 | Ferraiolo et al. ............. 331/16 |
| 5,811,998 | A | * | 9/1998 | Lundberg et al. ........... 327/156 |
| 5,892,407 | A | * | 4/1999 | Ishii ........................... 331/17 |
| 5,943,381 | A | * | 8/1999 | Zampetti .................... 375/376 |
| 6,150,889 | A | * | 11/2000 | Gulliver et al. ............... 331/14 |
| 6,166,606 | A |   | 12/2000 | Tsyrganovich ............... 331/25 |
| 6,186,140 | B1 | * | 2/2001 | Hoague .................. 128/202.22 |
| 6,282,589 | B1 | * | 8/2001 | Porterfield et al. ........... 710/52 |
| 6,356,158 | B1 |   | 3/2002 | Lesea ......................... 331/11 |
| 6,401,156 | B1 | * | 6/2002 | Mergard et al. ............. 710/266 |
| 6,636,122 | B1 | * | 10/2003 | Tsyrganovich ............... 331/25 |
| 6,665,802 | B1 | * | 12/2003 | Ober .......................... 713/320 |
| 6,862,605 | B1 | * | 3/2005 | Wilber ....................... 708/255 |

OTHER PUBLICATIONS

G. Fairhurst, "Phase Locked Loop (PLL)," United Kingdom, dated Jan. 10, 2001, downloaded on May 24, 2004 from http://www.erg.abdn.ac.uk/users/gorry/course/phy-pages/dpll.html, 2 pages.

(Continued)

*Primary Examiner*—Kenneth B. Wells
*Assistant Examiner*—Hai L. Nguyen
(74) *Attorney, Agent, or Firm*—Silicon Edge Law Group LLP; Darien K. Wallace; T. Lester Wallace

(57) ABSTRACT

A frequency locked loop in a microcontroller integrated circuit has a precision digital feedback control loop. The frequency locked loop performs a clock multiplication function such that an inexpensive and low frequency external crystal is usable to both clock a processor of the microcontroller with a higher frequency and low-jitter clock signal and to clock a real time clock of the microcontroller with a low frequency time base that is a power of two multiple of one hertz. In one embodiment, the digital feedback control loop includes a ramp generator, a digital filter, and a loop divider. The ramp generator is controlled to output steeper and steeper ramps as the frequency locking process proceeds toward frequency lock. A preset value that presets the loop divider is changed to adjust the phase of a feedback signal with respect to a reference input signal.

13 Claims, 11 Drawing Sheets

OTHER PUBLICATIONS

T. Olsson and Peter Nilsson, "An all-Digital PLL Clock Multiplier," Dept of Electroscience, Lund University, Lund, Sweden, date unknown (perhaps 2002), downloaded on May 24, 2004 from http://www.ap-asic.org/2002/proceedings/5B/5B-3.PDF, 4 pages.

T. Olsson and Peter Nilsson, "A Digital PLL made from Standard Cells," Dept of Electroscience, Lund Univerity, Lund, Sweden, date unknown (perhaps 2002), downloaded on May 24, 2004 from http://kontoret.webmaster.se/dockeeperfiles/340/887/A_Digital_PLL_made_from_Standard_Cells.pdf, 4 pages.

D. Abramovitch, "Lyapunov Redesign of Classical Digital Phase-Lock Loops," Agilent Labs, Palo Alto, CA, dated Jun. 5, 2003, downloaded on May 24, 2004 from http://www.labs.agilent.com/personal/Danny_Abramovitch/pubs/lpll_cdig_talk.pdf, 22 pages.

* cited by examiner

FREQUENCY LOCKED LOOP

CROSS-REFERENCE TO RELATED APPLICATION

The present application is a continuation-in-part of and claims the benefit under 35 U.S.C. §120 from U.S. patent application Ser. No. 09/973,979, now U.S. Pat. No. 6,636,122 B2, filed Oct. 9, 2001. The entire subject matter of U.S. patent application Ser. No. 09/973,979 is incorporated herein by this reference.

TECHNICAL FIELD

The present invention relates generally to timing measurement and pulse comparison circuits. The present invention relates more specifically to timing measurement and pulse comparison circuits in feedback circuits in voltage-controlled oscillators, especially voltage-controlled oscillators used in FLL (frequency locked loop) circuitry.

BACKGROUND

In electronics applications it is common to generate a desired clock signal at a frequency that is referenced to the frequency of a reference signal generated by a MRO (master reference oscillator). Phase locked loop oscillators may be used for this purpose if there is a coherent phase relationship between the clock signal and the reference signal. Sometimes, however, the clock signal generator may be of a class wherein the clock signal must be synchronized to an incoherent stimulus and then frequency locked oscillators may be used. There is a need for high performance frequency locked oscillators that can be embodied cheaply such as by using a semiconductor chip and a minimum of other component(s). Phase and/or frequency locked oscillator designs often include filters that have relatively long time constants. Thus, there is a further need for filters having long time constants, and that can be embodied cheaply, for example, by using a semiconductor chip and a minimum of other component(s).

SUMMARY

According to one aspect of the invention, a control signal generating circuit uses a digital filter having a relatively long time constant. Digital filters having relatively long time constants may be more readily and more economically embodied on semiconductor chips than are analog filters of comparable time constants. Oscillators incorporating digital filters having relatively long time constants may be more readily and more economically embodied on semiconductor chips than are analog filters of comparable time constants.

According to a specific aspect of the invention, a feedback circuit comprising at least one ramp generator; a clocked analog to digital converter circuit located downstream of the ramp generator; a conversion circuit for generating a digital correction; and a digital low pass filter for filtering the digital correction signal to produce a filtered correction signal is provided.

According to another specific aspect of the invention, a synchronized oscillator comprising a reference clock input adapted to receive a reference clock signal; a synchronizing signal input adapted to receive a synchronizing edge; a voltage-controlled oscillator for generating an output clock signal; and a feedback circuit adapted to receive the output clock signal and the reference clock signal, the feedback circuit generating the correction signal is provided.

According to another specific aspect of the invention, a method for generating a feedback signal comprising the acts of digitizing a first difference between leading edges of a first pulse and of a second pulse; digitizing a second difference between trailing edges of the first pulse and the second pulse; differencing the first difference and the second difference to produce a third difference; and performing digital to analog conversion upon a signal derived from the third difference is provided.

According to one more specific aspect of the invention, a filter comprising an analog to digital converter, a digital filter, an oversampling modulator for lowering signal bit respresentation, a digital to analog converter and an analog low pass for smoothing is provided.

According to one further specific aspect of the invention, an effective feedback circuit is implemented entirely, or to a great extent, on silicon and with few or no external off-chip interconnects and components.

Inventive feedback circuits may, for example, replace a feedback circuitry that is part of a frequency locked loop circuit such as that disclosed in U.S. Pat. No. 6,166,606 by the same inventor as the present application.

According to one more specific aspect of the invention, a frequency locked loop having a precision digital feedback control loop is provided as part of a microcontroller integrated circuit. The frequency locked loop performs a clock multiplication function such that an inexpensive and low frequency external crystal is usable to both clock a processor of the microcontroller with a higher frequency and low-jitter clock signal and to clock a real time clock of the microcontroller with a low frequency time base that is a power of two multiple of one hertz. In one embodiment, the digital feedback control loop includes a ramp generator, a digital filter, and a loop divider. The ramp generator is controlled to output steeper and steeper ramps as the frequency locking process proceeds toward frequency lock. A preset value that presets the loop divider is changed to adjust the phase of a feedback signal with respect to a reference input signal.

Other embodiments and advantages are described in the detailed description below. This summary does not purport to define the invention. The invention is defined by the claims.

DETAILED DESCRIPTION

U.S. Pat. No. 6,166,606 by the same inventor as the present application discloses a FLL (more precisely a phase and frequency locked clock generator) in which a feedback signal is generated to adjust the frequency of a resettable VCO (voltage controlled oscillator) to a frequency related to the frequency of a MRO (master reference oscillator). Because the VCO is resettable (capable of synchronizing with a non-coherent external event stimulus), there is no dependency upon any particular long-term phase relationship between the MRO and the VCO. For each of the MRO and VCO, a pulse is generated having a width of a certain respective fixed number of half-cycles of each respective signal and both pulses are fed into a pair of comparators. One of the comparators generates a leading edge gauge signal proportionate to the leading edge time differences of the two pulses. The other comparator generates a trailing edge gauge signal proportionate to the trailing edge time differences of the two pulses. Using an inverter and an analog summing circuit component, the two gauge signals are differenced and the signed result of differencing is fed to a low pass filter, the output of which is a desired signed feedback signal. The feedback signal is used to adjust the frequency of the VCO so as to tend to eliminate the net time differences between the gauge signal pulse widths and to cause the VCO to operate at desired frequency. The desired VCO frequency has a simple fixed relationship with the frequency of the MRO.

Embodiments of the present invention may be implemented using at least one digital filter having a relatively long time constant and at least one analog filter having a relatively short time constant. Such an arrangement minimizes the need for relatively expensive off-chip components.

Figure 1:
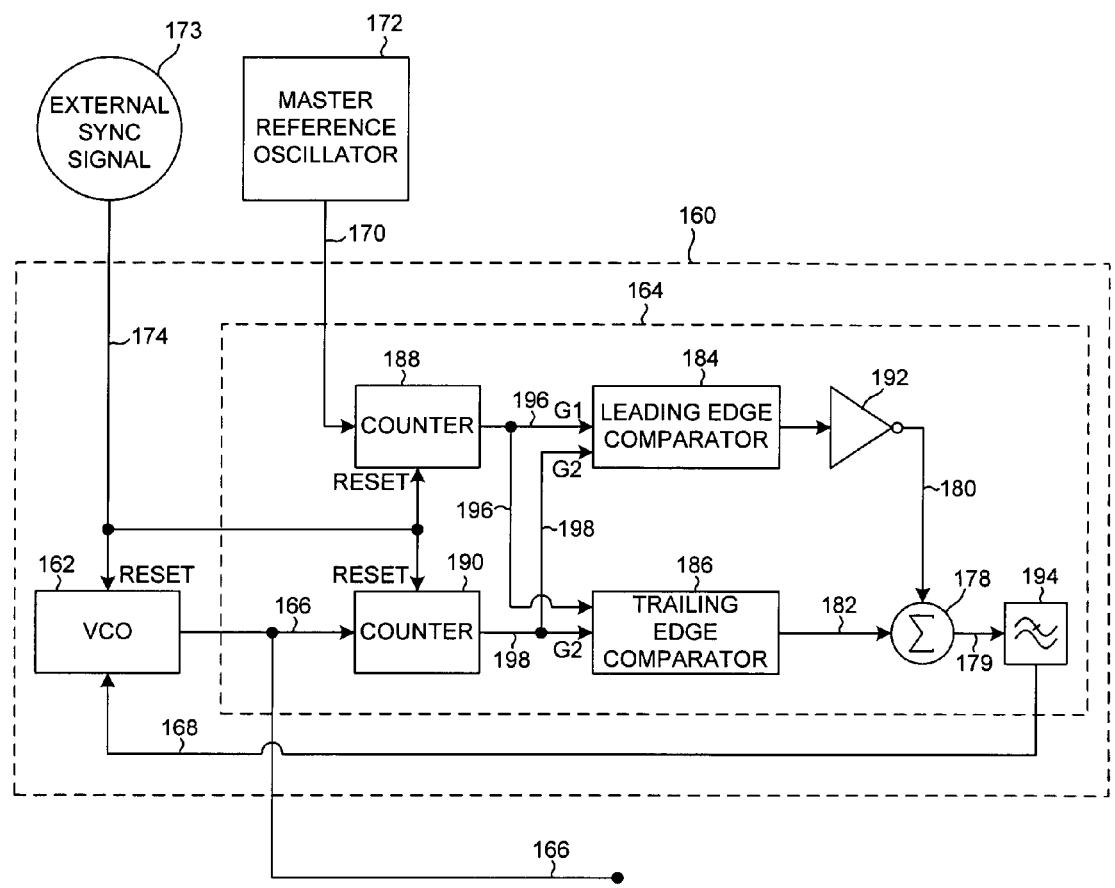
FIG. 1 shows a block diagram of a frequency locked oscillator.

FIG. 1 shows an embodiment of a frequency locked loop 160. The frequency locked loop as shown comprises two sections: a voltage-controlled oscillator 162 for generating an output clock signal 166, and a feedback circuit 164 for providing a correction signal 168 to control the frequency of the output clock signal 166 generated by the voltage-controlled oscillator 162. The frequency locked loop 160 is provided with a system clock signal 170 running at exactly a required frequency by a system clock generator or MRO (master reference oscillator) 172. The system clock is sometimes termed a reference clock, and some systems may have more than one system clock and/or reference clock. It should be noted that the system clock signal 170 is not synchronized with the synchronizing signal 174. The system clock signal 170 is, however, running at exactly the required output clock frequency. Thus, this frequency locked loop 160 is designed to generate the synchronized output clock signal 166 running at the same frequency as that of the system clock signal 170 while also having an edge synchronized with the synchronizing signal 174. Synchronizing signal 174 is provided by external SYNC signal source 173 which need not be coherent.

As shown in FIG. 1, a VCO (voltage-controlled oscillator) 162 is provided with a correction signal 168 to control the frequency of the output clock signal 166. In the embodiment as shown, the correction signal 168 is a filtered control signal provided by the feedback circuit 164. The LPF (low pass filter) 194 operates on an unfiltered control signal 179 to produce the correction signal 168. The unfiltered control signal 179 is provided by an analog summing circuit component 178 by combining two compensation pulses on conductors 180, 182. Specifically, the first compensation pulse is an inverted value from the output of a leading edge comparator 184, whereas the second compensation pulse is the output of a trailing edge comparator 186. The control signal 179 is, in effect, generated by subtracting the output of the leading edge comparator 184 from the output of the trailing edge comparator 186, thus performing comparison of the time durations of two gauge signals 196, 198. In addition, in the embodiment shown, the synchronizing signal 174 is provided to the VCO (voltage-controlled oscillator) 162 to reset the VCO 162. The voltage-controlled oscillator 162 begins to oscillate so that the first voltage transition of the output clock signal 166 of the voltage-controlled oscillator 162 coincides with a triggering edge of a synchronizing signal 174.

Still referring to FIG. 1, the feedback circuit 164 comprises two counters (i.e., a first counter 188, and a second counter 190) and two edge comparators 184, 186, an inverter 192, an analog summer 178 and a low pass filter 194. As shown in FIG. 1, the system clock signal 170 from the MRO 172 is provided to the first counter 188, whereas the output clock signal 166 generated by the VCO 162 is provided to the second counter 190. In addition, both the first and second counters 188, 190 are fed with the synchronizing signal 174 for simultaneous reset. The synchronizing signal 174 is used in this embodiment for resetting the two counters because the synchronizing signal 174 is readily available. When an edge signifying reset on the external synchronization signal 174 is received, both two counters 188, 190 are released to begin counting the numbers of pulses received.

Still referring to FIG. 1, the first counter 188 generates the first gauge signal G1 196 by reference to edges of the system clock signal 170, whereas the second counter 190 generates a second gauge signal G2 198 by reference to edges of the output clock signal 166. In the embodiment as shown, the first gauge signal G1 196 comprises a pulse having a first leading edge voltage transition (212, FIG. 2) that coincides with the first rising edge voltage transition (213, FIG. 2) of the system clock signal 170 after the edge signifying reset on the external synchronization signal 174. Furthermore, the second trailing edge voltage transition of the pulse coincides with a falling edge voltage transition of the system clock signal 170 a preset number N clock half-cycles after the reset signal is actuated. In this particular embodiment, N is a predetermined positive number that is an odd multiple of one half. In one particular exemplary embodiment N had a value of 1001.

Figure 2:
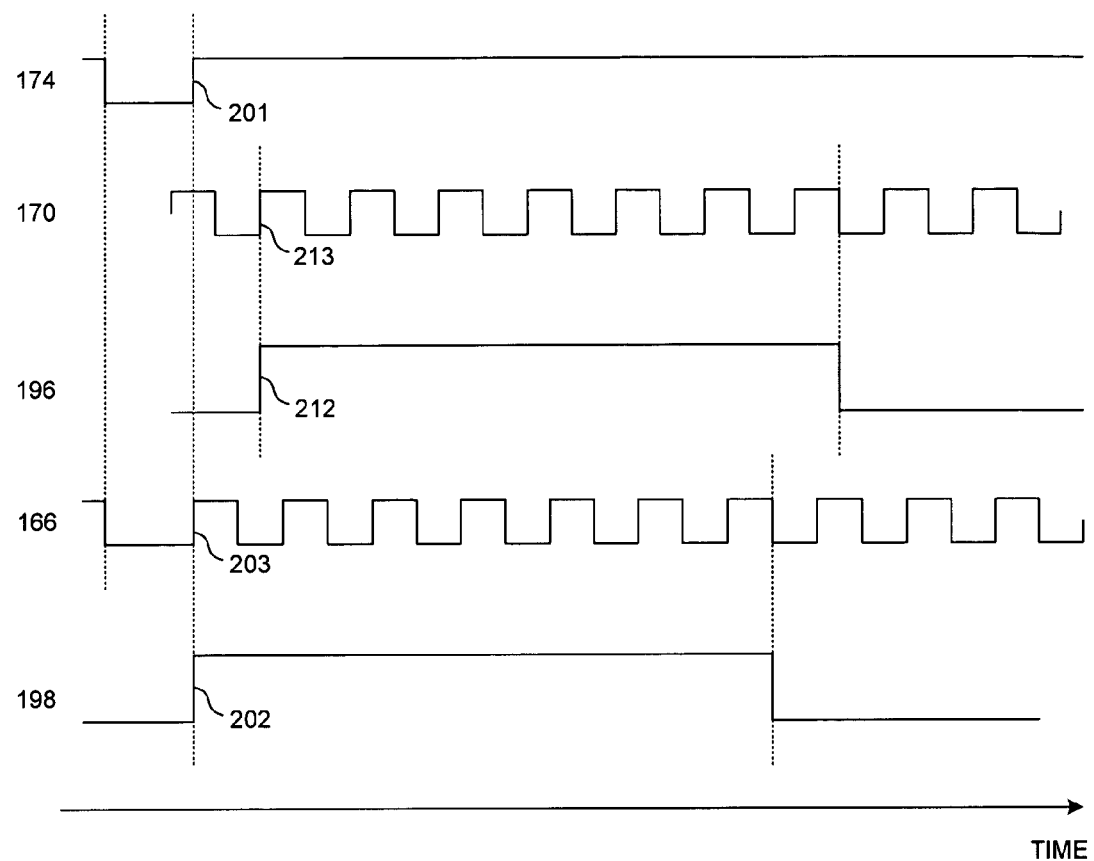
FIG. 2 shows timing diagrams of an embodiment of a frequency locked oscillator.

FIG. 2 shows a timing diagram showing relationships between various signals in the circuit of FIG. 1: external synchronization signal 174, system clock signal 170, gauge signal (pulse) G1 196, VCO output clock signal 166 and gauge signal (pulse) G2 198. The timing diagrams are exemplary only and other variations are possible, for example, external synchronization signal 174 is shown as a negative going pulse that is active on its trailing edge but it could, in other embodiments, be a positive going pulse or another form. FIG. 2 shows the relationship between the trailing (rising) edge 201 of external synchronization signal 174 to the leading (rising) edge 202 of gauge signal G2 198 and the first synchronized edge 203 of VCO output signal 166. In the example timing diagram of FIG. 2, each counter is set to count 13 half-cycles of clock signal for the pulse width since 13 half-cycles facilitates diagramming, but practical embodiments will typically use pulses having a duration of many more than 13 half cycles of clock signal. FIG. 2 also shows the relationships between the trailing (rising) edge 201 of external synchronization signal 174, the next rising edge 213 of the reference clock signal 170, and the leading edge 212 of gauge signal G1 196.

Still referring to FIG. 2, the second gauge signal G2 198 has a pulse having a rising (leading) edge voltage transition 202 that coincides with the first rising edge voltage transition 203 of the output clock signal 166 generated by the VCO (162, FIG. 1) after a reset signal is released. The external synchronization signal 174 is used as the reset signal. The trailing edge voltage transition of the pulse G2 198 coincides with a falling edge voltage transition of the output clock signal 166 generated by the voltage-controlled oscillator 162 exactly N clock half-cycles after the edge 201 signifying reset on the external synchronization signal 174 is received. In the embodiment described above, the same predetermined value to produce a pulse of N cycles is programmed into both counters 188, 190 and the MRO 172 and the VCO 162 operate at substantially the same frequency.

In other embodiments, the MRO 172 and the VCO 162 may operate at different frequencies, typically harmonically related, but possibly related one to the other by a ratio that is preferably a simple rational number. In cases of differing operating frequencies for MRO 172 and VCO 162, the counters 188, 190 are programmed with proportionate numbers so that pulses in the gauge signals 196, 198 may have equal duration at the desired operating point. For example, if the frequency of the MRO were three times the frequency of the VCO, then the value programmed into the first counter 188 may be three times the value programmed into the second counter 190.

Figure 3:
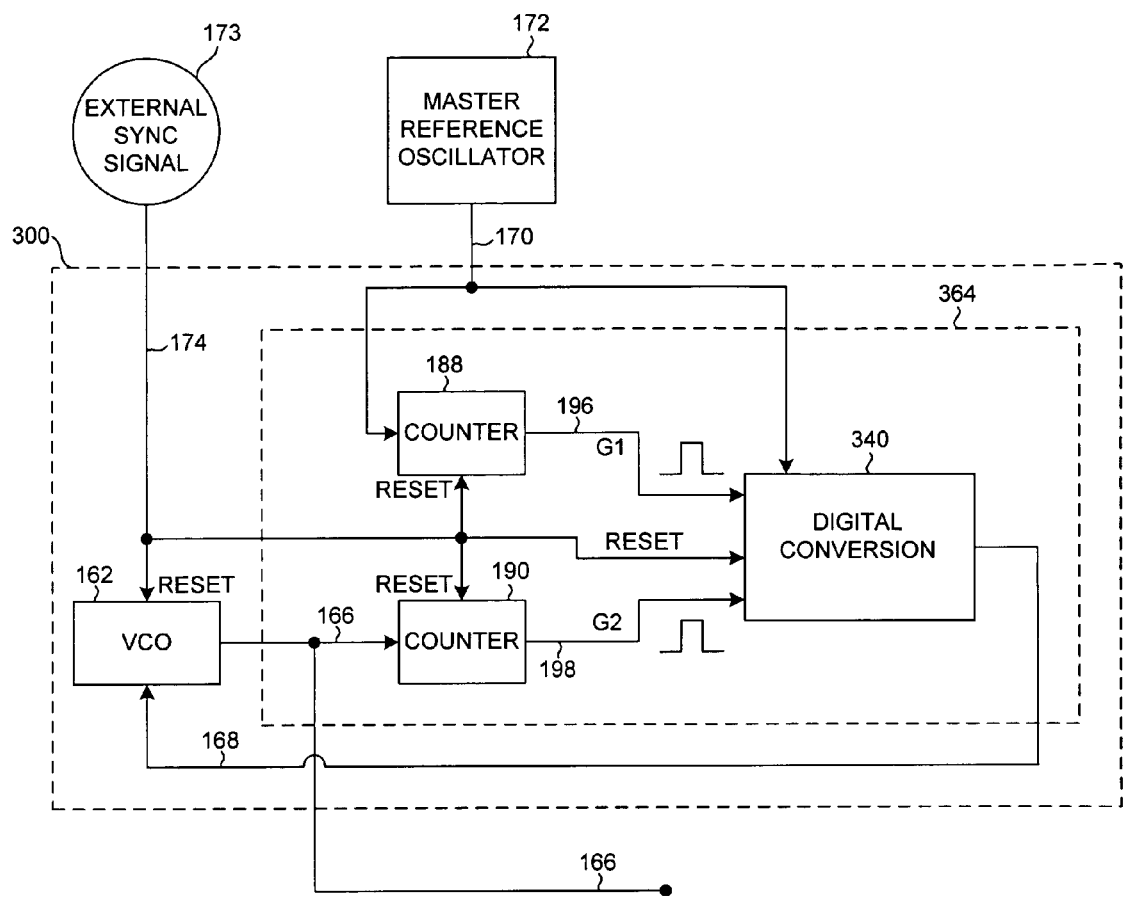
FIG. 3 shows a block diagram of an embodiment of a frequency locked oscillator according to an aspect of the invention.

FIG. 3 shows a block diagram of a frequency locked oscillator according to an aspect of the invention. Comparing the oscillator 300 with the oscillator 160 of FIG. 1, both generate gauge signals G1 196 and G2 198. However, in oscillator 300 alone, a digital conversion circuit 340 is used to generate feedback signal 168. Amongst other possible benefits, digital conversion circuit 340 can be more economically constructed than analog low pass filter 194 (FIG. 1) in the previously developed embodiments.

The frequency locked oscillator 300 of FIG. 3 has two sections, a VCO 162 and a feedback circuit 364. Counter 188 is programmed with an integer number to specify a fixed number N of system clock signal 170 half-cycles. Counter 190 is programmed with an integer number to specify a fixed but possibly different number M of output clock signal 166 half-cycles. The frequencies of the MRO 172 and VCO 162 may typically be related in a simple ratio in which case the counter may be programmed with fixed numbers N and M that may be related in a like ratio. When triggered from RESET by an external synchronization signal 174, each counter 188, 190 outputs a gauge signal which includes a positive going pulse of width equal to N or M half-cycles respectively of the respective clock signal input to the respective counter.

A pulse on gauge signal G2 198 generated by counter 190 has a width of M half-cycles of the output clock signal 166 of the VCO 162. VCO 162 is frequency controlled by feedback signal 168 and is reset by external synchronization signal 174. Thus the output clock signal 166 of VCO 162 is synchronized to external synchronization signal 174.

A pulse on gauge signal G1 196 generated by counter 188 has a width of N half-cycles of the system clock signal 170 which is the output of master reference oscillator 172. MRO 172 is free running and not synchronized with external synchronization signal 174. However, counter 188 is synchronized with external synchronization signal 174. Thus, each pulse on gauge signal G1 196 generated by counter 188 has a leading (rising) edge that coincides with first rising edge of system clock signal 170 that occurs after the active edge of external synchronization signal 174.

In the desired operating condition MRO 172 and VCO 162 operate at the exactly correctly related frequencies and the frequencies of system clock signal 170 and output clock signal 166 are in the correct precise ratio. In this desired operating condition pulses on gauge signal G1 196 and gauge signal G2 198 have the same duration, but as discussed above they are not mutually synchronized edge to edge. In fact, the leading edges may fail to coincide by as much as approximately one clock cycle of MRO 172.

Figure 4:
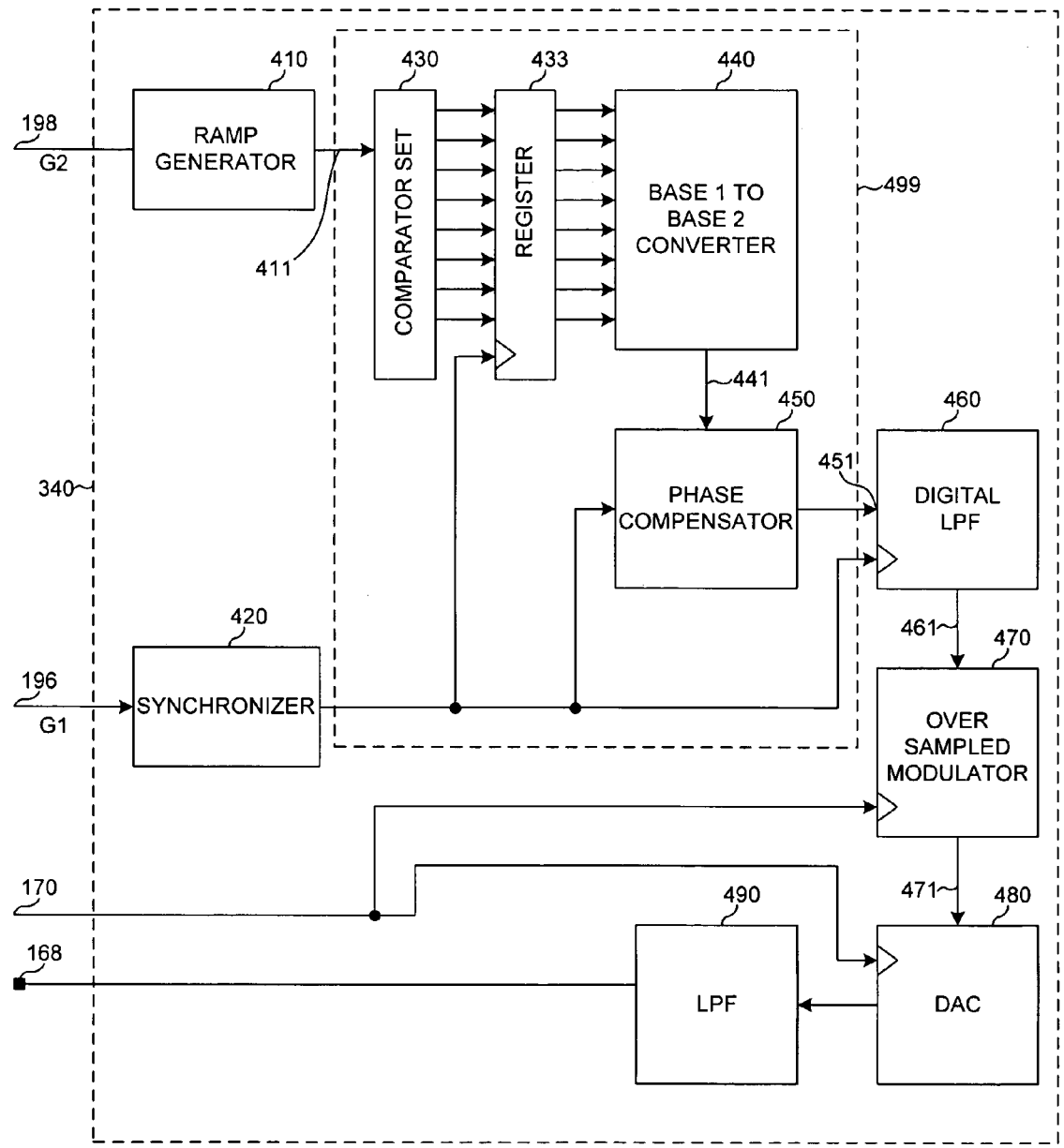
FIG. 4 shows a block diagram of a digital conversion circuit used generate feedback signal according to an aspect of the invention.

FIG. 4 shows a block diagram of a digital conversion circuit used to generate feedback signal 168 according to an aspect of the invention. Digital conversion circuit 340 has two pulsed inputs, gauge signal G1 196, and gauge signal G2 198. Digital conversion circuit 340 also receives system clock signal 170. Digital conversion circuit 340 has one output, analog feedback correction signal 168. Each of the pulses carried by gauge signals G1 196 and G2 198 has a rising edge and a falling edge. Because gauge signal G2 198 is locked to the external synchronization signal 174 (FIG. 2), it will have a rising edge that occurs prior to or simultaneously with the rising edge of the corresponding pulse carried by gauge signal G1 196.

Still referring to FIG. 4, when a rising edge of pulse on G2 198 triggers ramp generator 410 a ramp signal 411 is produced. Techniques for ramp generators are well known in the art and may take various forms.

Figure 5:
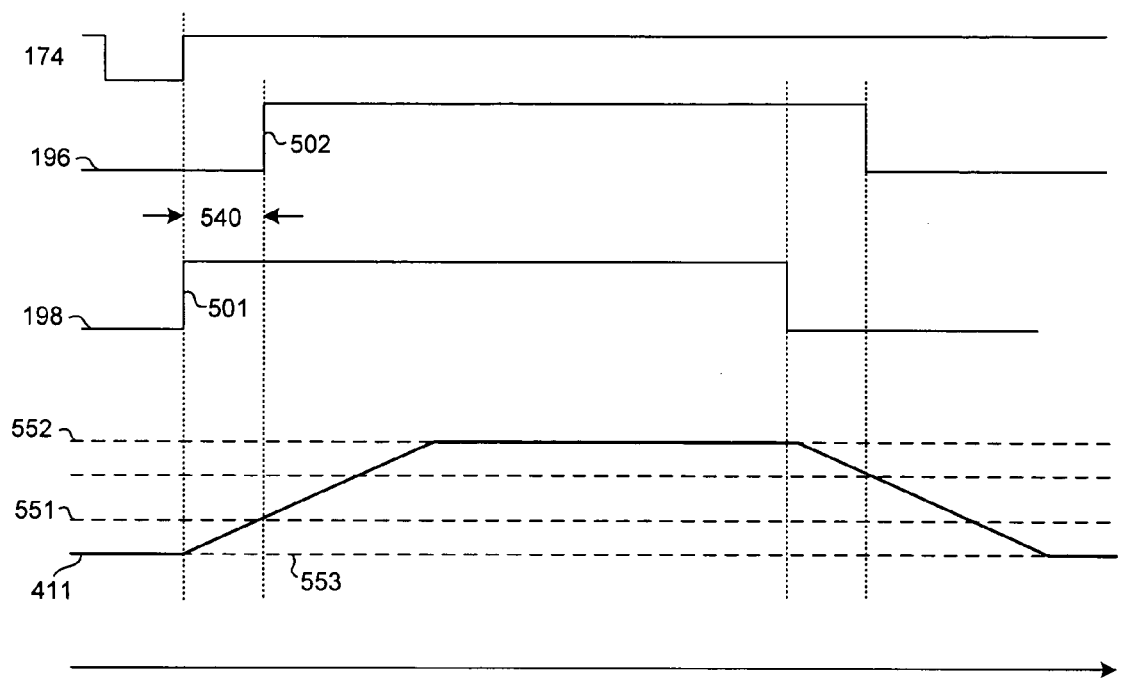
FIG. 5 shows timing diagrams of an embodiment of a frequency locked oscillator according to an aspect of the invention.

FIG. 5 shows a timing diagram for an oscillator according to FIG. 3, with external synchronization signal 174, pulses of gauge signals G1 196, G2 198 and ramp signal 411. At the moment of leading edge 501 of pulse on gauge signal G2 198, a ramp signal 411 begins to slew from datum 553 towards a rail voltage 552. The ramp signal may typically take a little more than one cycle of the system clock signal to slew from datum to rail. Later, upon the leading edge 502 of pulse on gauge signal G1 196, ramp signal 411 has a snapshot voltage 551 which is some fraction of rail voltage 552. This snapshot voltage 551 is dependent upon, and hence a measure of, the leading edges time difference 540 between the leading edge 501 of pulse on gauge signal G2 198 and the leading edge 502 of pulse on gauge signal G1 196. Ramp generator 410 (FIG. 4) may generate a ramp that may be non-linear; the exact shape of the ramp signal 411 is not critical. As described below, the digital conversion circuit is responsive to the snapshot voltage 551.

Figure 6:
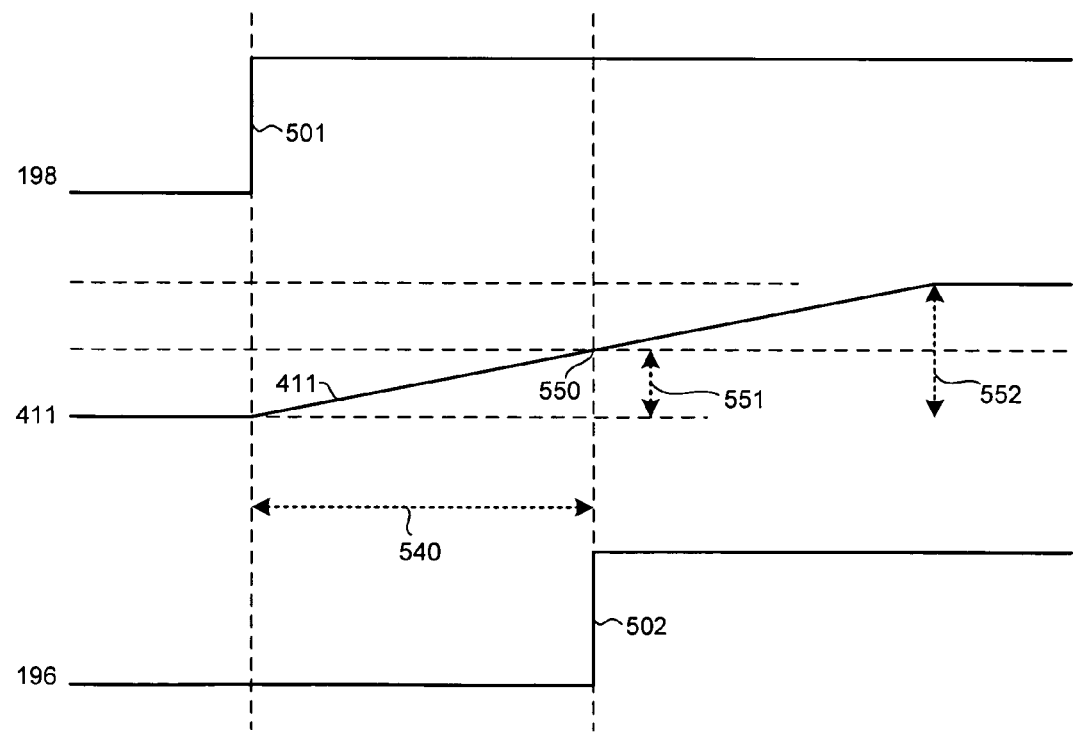
FIG. 6 shows further timing diagrams of an embodiment of a frequency locked oscillator according to an aspect of the invention.

FIG. 6 shows an enlarged version of part of the timing diagrams of FIG. 5. The same reference numbers are used for the same features, however, FIG. 6 shows more clearly the relationship between the leading edges time difference 540 and the snapshot voltage 551. As the frequency of the VCO changes under the influence of the analog feedback signal then so will the leading edges time difference 540 change. As the leading edges time difference 540 changes so will the snapshot voltage 551. The snapshot voltage 551 thus represents an error (leading edges time difference 540) due to the mismatch in the leading edges of signals G1 196 and G2 198. As described below, this error is to be subtracted from a similar error due to the trailing edges time difference.

Referring back to FIG. 4, ramp signal 411 becomes input to a comparator set 430. Comparator sets are well known in the art and may be embodied, for example, as a set of threshold detectors wherein each threshold is a successive fraction of a full-scale input. Threshold detectors may, for example, be implemented as comparators connected to reference voltage sources. Thus, comparator set 430 has a number of binary (2-state) outputs, one for each threshold detector. The number of threshold detectors determines the accuracy of the error measurement. For example, FIG. 4 shows comparator set 430 as having eight binary outputs and hence eight threshold detectors. Each threshold detector output is turned on (binary 1) whenever the ramp signal exceeds the threshold voltage for the corresponding detector or comparator. The outputs of comparator set 430 are latched into register 433 in response to register 433 being clocked by synchronizer 420. Synchronizer 420 receives a pulse on gauge signal G1 196 and clocks register 433 upon either edge of the pulse (rising or falling). Considering for a moment the case where register 433 is clocked by synchronizer 420 for the rising edge of pulse on gauge signal G1 196, the value latched into the register is the number of comparators turned on at that moment which value, in turn, depends upon the snapshot voltage 551 (FIGS. 5 and 6). Thus, the value latched into register 433 may be viewed as a base 1 number that represents the approximate value of snapshot voltage 551 (FIGS. 5 and 6) and thus represents a measure of the leading edges time difference 540 (FIGS. 5 and 6). The use of a register allows the value to be captured and held steady pending further downstream processing.

Still referring to FIG. 4, the Base 1 to Base 2 Converter 440 converts the latched output of register 433 to a conventional unsigned binary (base 2) number represented on multiple conductor output 441. This binary number also represents (may be roughly proportional to) the leading edge time difference 540. Taken together, the combination of comparator set 430, register 433 and Base 1 to Base 2 Converter 440 may be broadly regarded as constituting a clocked ADC (analog to digital converter) circuit 499. Other forms of clocked ADC circuit are possible within the general scope of the invention. Additional signal conditioning may be provided with advantage, and the clocked ADC or equivalent circuits could be operably configured with different topology, but still downstream of a ramp generator.

A similar sequence of events may take place on the corresponding falling edges of the pulses in the gauge signals G1 196 and G2 198. A second binary number (also appearing on conductors 441) may be generated to represent the trailing edge time difference between the pulses on gauge signals G1 196 and G2 198. Synchronizer 420 strobes phase compensator 450 to receive one after the other numbers representing the two edge time differences and to perform simple binary subtraction to produce a signed binary number that represents a difference in width (duration) between the two pulses. This signed binary number representing the difference in duration of the two pulses is thus a measure of the frequency difference between the MRO and the VCO. The same signed binary number becomes used as a digital unfiltered VCO correction signal and is sent to multiple conductor port 451. Signed binary number on port 451 is fed to digital LPF (low pass filter) 460 which, precisely because it is digital, may have a long time constant without the use of expensive analog components. Also, since the digital LPF 460 performs essentially a smoothing operation, it may usefully have an output precision considerably greater than the input 451. In one exemplary embodiment, the signed binary number input to the digital LPF input 451 is 4 bits wide (limited primarily by the resolution of the comparator set) and the LPF output 461 is 16 bits of resolution. Greater resolution than that provided by a 16 bit output from the digital LPF 460 may be required for some applications. At the desired operating point of equal or correctly related MRO and VCO frequencies, the correction signal presented on port 451 will be zero. The output of the digital LPF may usefully be an unsigned number with the ideal operating point at mid-range.

Still referring to FIG. 4, the digital LPF output 461 is fed to an oversampling noise reshaping modulator 470 which operates according to techniques that are well-known in the art. Noise reshaping modulators convert slow changing high precision inputs to fast changing low precision outputs that, suitably scaled, have the same precise average value as the corresponding input (assuming an invariant input).

The oversampling noise reshaping modulator 470 may be clocked by any convenient high frequency clock source such as the system clock signal 170. In the present context, oversampling implies that the oversampling noise reshaping modulator 470 samples its input signal and generates an output signal at a rate far in excess of the rate at which the input is changing. Since the input to oversampling noise reshaping modulator 470 is the output signal of the digital LPF, and since the digital LPF has a long time constant, in fact the input to the noise reshaping modulator 470 changes quite slowly. Thus, the same input value will be sampled many times. If the MRO runs at 50 MHz (which is a realistic possible value, however, the invention can operates over an extremely broad range of frequencies), then the output of noise reshaping modulator 470 is modulated at 50 MHz also. Output port 471 of noise reshaping modulator 470 may typically be four bits wide, allowing the modulator to generate values in the range −8 to +7 for example.

Figure 7:
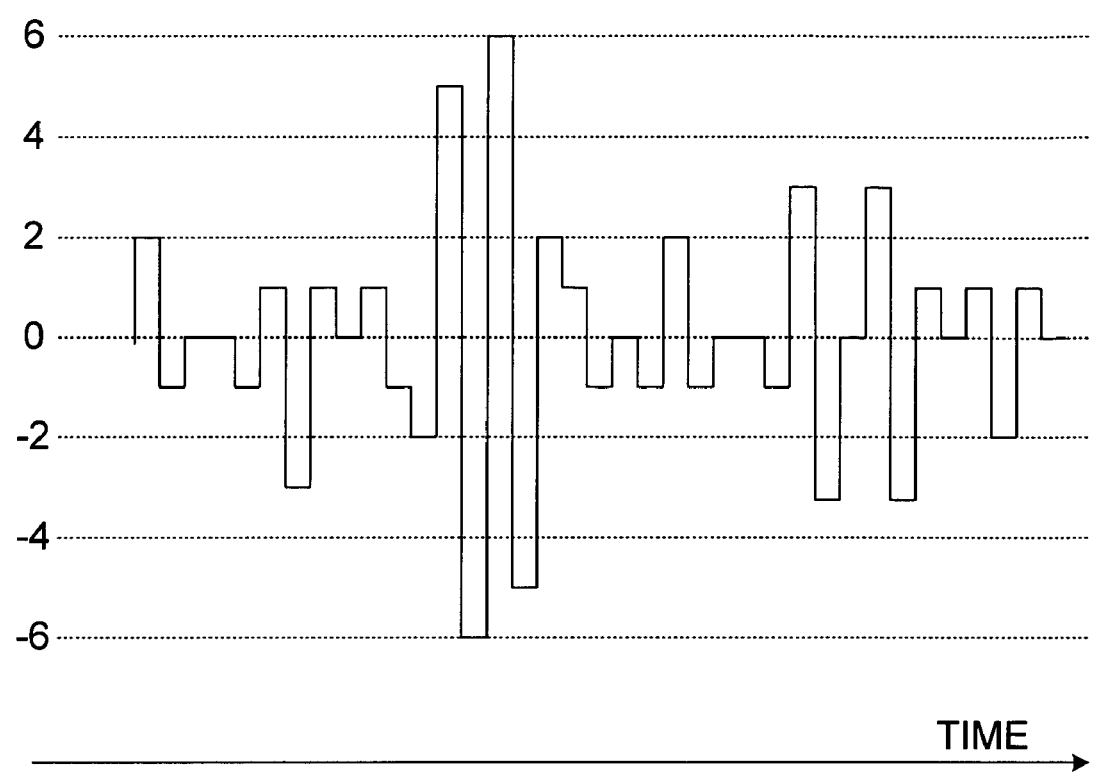
FIG. 7 shows typical oversampling modulator output waveforms of an embodiment according to an aspect of the invention.

FIG. 7 shows a typical output signal from noise reshaping modulator 470, changing output signal level at intervals equivalent to 50 MHz. The use of 50 MHz, or indeed of the system clock signal 170 is not at all critical and noise reshaping modulator 470 may be clocked by any high frequency signal that might be conveniently available. An aspect of a noise reshaping modulator is that it may convert a lower data rate/higher precision signal into a higher data rate/lower precision signal whilst maintaining sufficient accuracy. The noise reshaping modulator 470 may operate in accordance with well-known Sigma-Delta principles. Thus, the average, over a time interval, of the output signal value is at a correct level and may have a good precision even though the level of output signal itself may have a lower precision and may change continually. In the example shown in FIG. 7, the output precision is four bits in precision and so the noise reshaping modulator 470 output port 471 (FIG. 4) has correspondingly at least four conductors. A binary four bit number may permit integer values in the range −8 to +7 to be represented.

Referring back to FIG. 4, the (typically four bits wide) output signal of the noise reshaping modulator 470 is input to a DAC (digital to analog converter) 480 which has a typical precision of only four bits. Such a DAC may be economically constructed because it requires only a few current sources to implement. DAC 480 may be clocked by the same clock signal 170 that is used to strobe the noise reshaping modulator 470. The output from DAC 480 is a rapidly changing low precision current, the average value of which represents the time difference between the pulse widths and hence the value of the feedback signal 168. A short time constant VHF LPF (very high frequency low pass filter) 490 is required to generate a stable feedback signal 168 free of significant noise and with a slew rate determined by the long time constant of the digital LPF 460. In the exemplary embodiment of a 50 MHz clock rate into noise reshaping modulator 470, VHF LPF 460 could be implemented with a time constant on the order of one microsecond. Since the VHF LPF 490 implements a very small time constant, it can be embodied as a capacitor on-Silicon and thus the entire frequency locked loop 300 (FIG. 3) can be embodied on-chip with great economy as compared to previously developed embodiments of circuits that perform similar functions.

All references referred to herein are incorporated by reference in their entireties.

Figure 8:
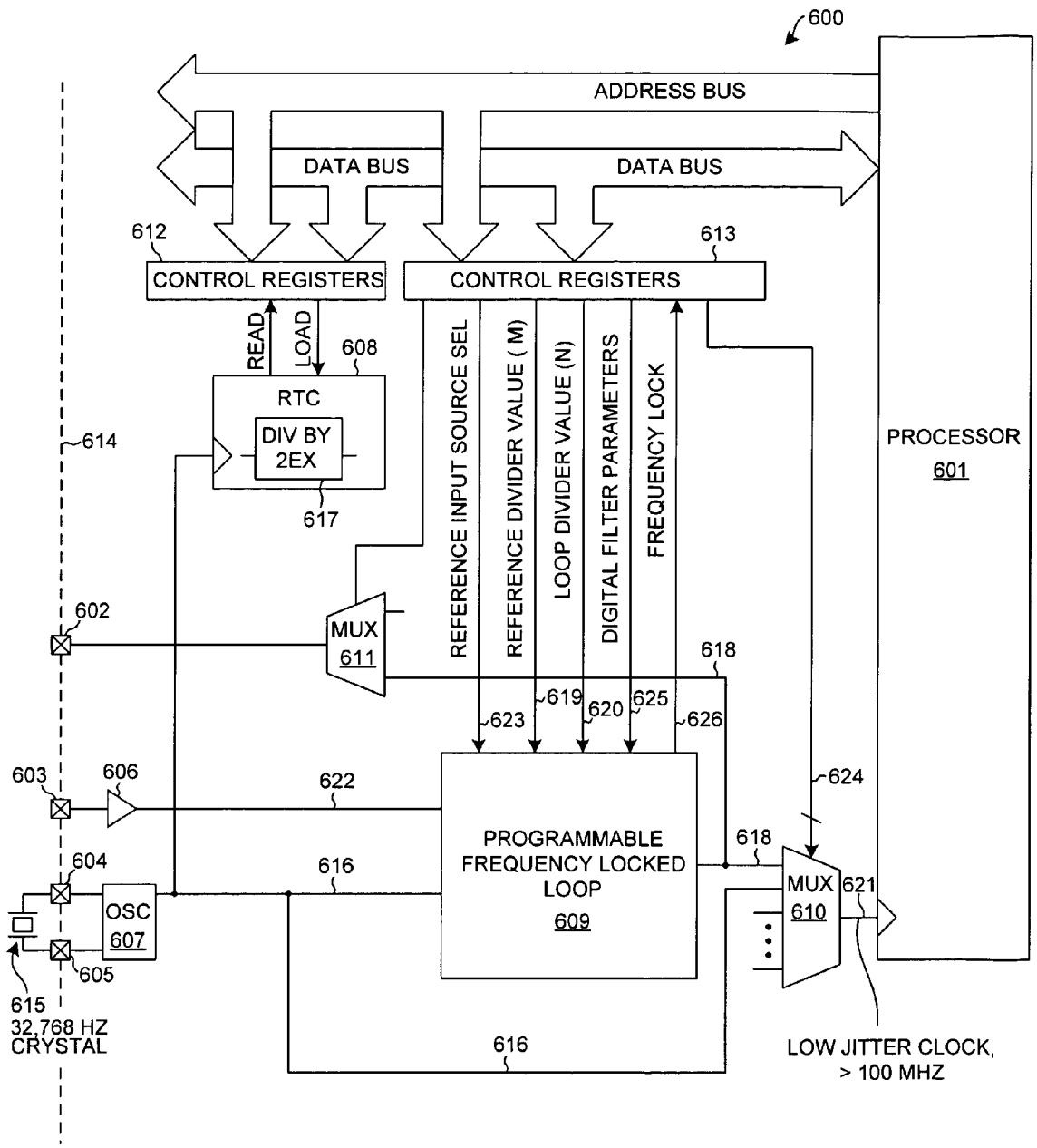
FIG. 8 is a diagram of a microcontroller in accordance with one embodiment. A frequency locked loop of the microcontroller is usable to perform a clock multiplication function such that a low frequency and inexpensive external crystal is usable to supply a processor of the microcontroller with a low jitter high frequency clock signal at the same time that a real time clock of the microcontroller is supplied with a low frequency clock signal that is a power of two multiple of one hertz. The amount of power consumed by an on-board crystal oscillator is small because the external crystal is a low frequency crystal.

FIG. 8 is a block diagram of a microcontroller integrated circuit 600 in accordance with another embodiment. Microcontroller 600 includes a processor 601, a plurality of terminals 602–605, input buffer circuitry 606, a crystal oscillator circuit 607, a real time clock 608, a programmable frequency locked loop circuit 609, a pair of multiplexers 610–611, and a plurality of control registers 612 and control registers 613. Dashed line 614 represents the edge of the microcontroller integrated circuit.

The crystal oscillator circuit 607 is coupled via terminals 604 and 605 to an inexpensive external low frequency crystal 615 such that crystal oscillator circuit 607 generates a first clock signal onto conductor 616. The term "low frequency" here denotes a frequency of less than 5 megahertz. Conductor 616 communicates the first clock signal both to frequency locked loop 609 and to real time clock 608.

In the specific example illustrated, crystal 615 is a mass produced and therefore typically inexpensive and readily available 32,768 hertz crystal. The first clock signal is a 32,768 hertz signal. Because the frequency of the first clock signal is 32,768 hertz, a simple fifteen stage binary counter 617 within real time counter 608 divides the 32,768 hertz first clock signal down by 2E15 to generate a one hertz time-base signal that is used within real time clock 608. Processor 601 can read the current time from real time clock 608 and can control real time clock 608 using control registers 612.

Frequency locked loop 609 generates a second clock signal that is output onto conductor 618. The second clock signal is frequency locked to a selectable one of: 1) the first clock signal on conductor 616, and 2) a third signal on conductor 622. The third signal is received onto microcontroller 600 via terminal 603 and is conducted to frequency locked loop 609 via input circuitry 606 and conductor 622. Whether frequency locked loop 609 locks onto the first clock signal on conductor 616 or the third signal on conductor 622 is controlled by processor 601 by writing to an appropriate bit in control registers 613. Writing a reference input source select value into this bit causes control registers 613 to supply a reference input source select signal to frequency locked loop 609 via conductor 623.

The frequency of the second clock signal is a multiple of the frequency of the signal onto which the frequency locked loop locks. Processor 601 can set this multiple by writing a reference divider value M and a loop divider value N. Reference divider value M is written by writing corresponding bits in control registers 613, which in turn causes the written value to be supplied to frequency locked loop 609 via conductors 619. Loop divider value N is written by writing corresponding bits in control registers 613, which in turn causes the written value to be supplied to frequency locked loop 609 via conductor 620.

In the illustrated example, the second clock signal is a low-jitter clock signal that has a frequency that is higher than 100 megahertz. This second clock signal is supplied onto a clock input lead 621 of processor 601 via multiplexer 610. Whereas using an analog filter in the feedback control loop within frequency locked loop 609 may produce unwanted jitter in the second clock signal, the feedback control loop within the frequency locked loop 609 includes a digital filter as will be explained below in more detail. The second clock signal supplied to processor 601 therefore has a relatively small amount of jitter and is suitable for clocking processor 601 where processor 601 is executing a control loop requiring precision (for example, a control loops that controls an external motor).

It is often desired to clock the processor of a microcontroller using a high frequency clock signal (for example, having a frequency greater than 100 megahertz) such that the processor within the microcontroller executes more instructions in a given period of time. If an external crystal of such a high frequency were used, then the large physical sizes of the crystal impose relatively large parasitic capacitances on the oscillator terminals. Charging and discharging such large parasitic capacitances at high frequency would result in significant power consumption. Accordingly, rather than using such a high frequency crystal, on-board frequency lock loop 609 is provided on microcontroller integrated circuit 600 and this frequency locked loop 609 is usable as a clock multiplier. Using frequency locked loop 609 as a clock multiplier allows a low frequency external crystal to be used even if the processor 601 is to be clocked with a higher frequency clock signal. Not only is the low frequency crystal smaller in physical size, but it is also driven at a lower frequency. Consequently, any parasitic capacitances that are present due to using an external crystal do not have to be charged and discharged as rapidly. This results in lower power consumption. Such lower power consumption allows microcontroller 600 to have a longer operating life in low power battery-powered applications.

Not only does providing the frequency locked loop 609 on microcontroller 600 result in lower power consumption in certain applications, but providing on-board frequency locked loop 609 can reduce system cost because a high frequency and expensive external crystal or crystal oscillator need not be provided in the system if the processor is to be clocked at the higher frequency. Rather, the processor 601 can be clocked with a low jitter high frequency clock signal that is generated using a mass produced and therefore inexpensive low frequency external crystal. One example of such a mass produced low frequency crystal is a 32,768 hertz crystal.

Rather than supplying the second clock signal on conductor 618 to the clock input lead 621 of processor 601, multiplexer 610 can be controlled using select input leads 624 to supply one of another plurality of signals onto clock input lead 621. For example, processor 601 can control multiplexer 610 such that the first clock signal on conductor 616 is supplied onto clock input lead 621. Processor 601 controls the select value on the select leads of multiplexer 610 by writing corresponding bits in control registers 613.

In some embodiments, the digital filter in the feedback control loop within frequency locked loop 609 has characteristics determined by filter parameter values that are loaded into the frequency locked loop 609 via conductors 625. The processor can load these filter parameter values into the frequency locked loop 609 by writing corresponding bits in control registers 613.

In the illustrated embodiment, frequency locked loop 609 outputs a frequency lock signal onto conductor 626. This frequency lock signal indicates whether the second clock signal is frequency locked with respect to the signal on the selected one of conductors 622 and 616. Processor 601 can read the frequency lock signal by reading a corresponding bit in control registers 613.

Processor 601 can cause a signal output by the frequency locked loop 609 to be output onto terminal 602. Whether the signal on conductor 618 is supplied onto terminal 602 or not is determined by a corresponding bit written into control registers 613. The value of this bit determines a select value supplied onto the select input lead of multiplexer 611.

Figure 9:
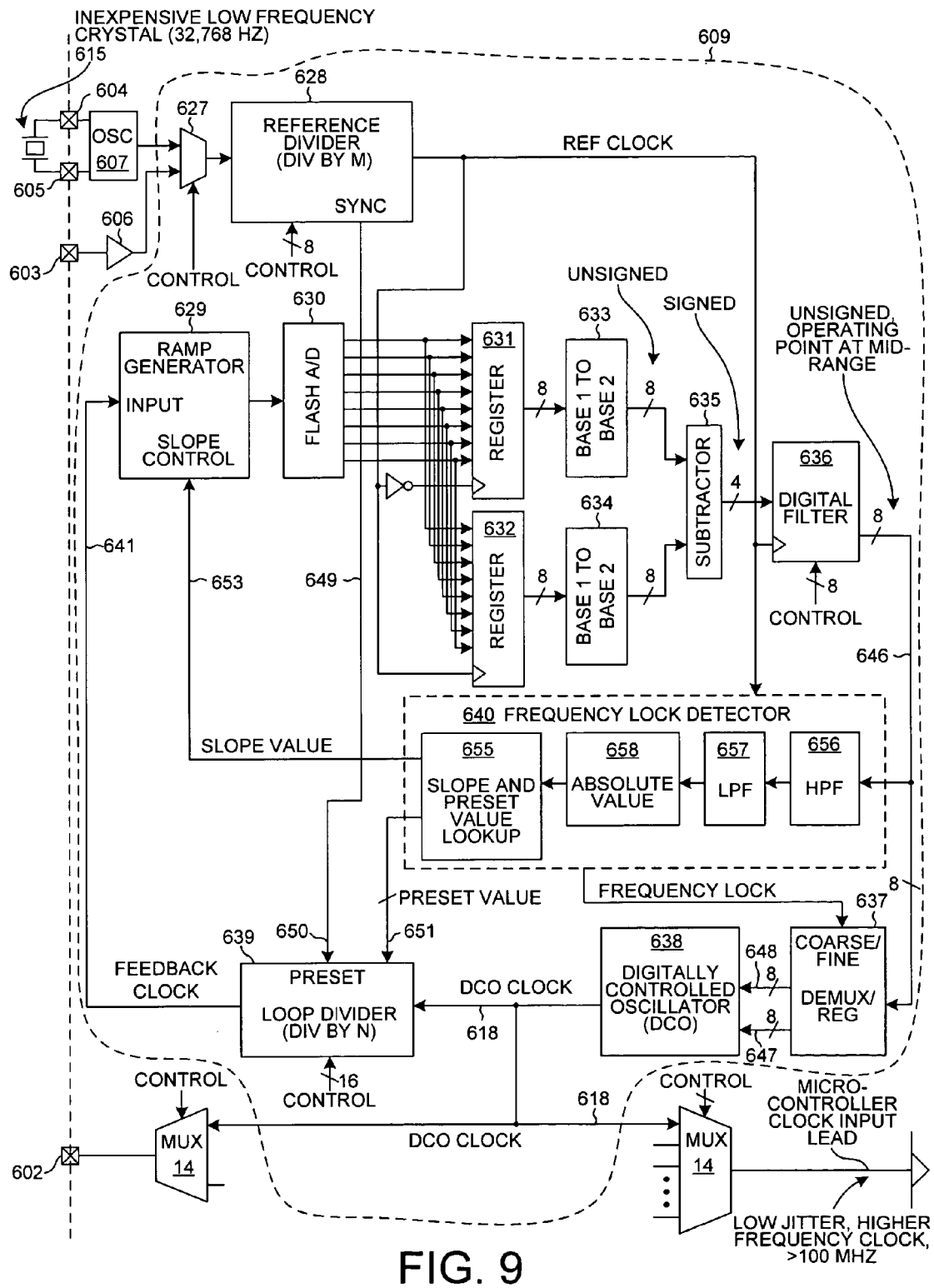
FIG. 9 is a diagram of one specific example of the frequency locked loop of the embodiment of FIG. 8. The circuit moves noise to higher frequencies, then converts the signal into the digital domain, and then filters the result using a digital filter. Using a digital filter in this way allows loop filtering to be done using a smaller amount of integrated circuit area than would otherwise be required using a conventional analog loop filter. It also results in better gain stability which allows the use of stronger feedback gain.

FIG. 9 is a diagram of one particular example of frequency locked loop 609. Frequency locked loop 609 includes an input multiplexer 627, a reference divider 628, an adaptive slope ramp generator 629, a flash analog-to-digital converter 630, a pair of registers 631 and 632, a pair of base one to base two circuits 633 and 634, a digital subtractor circuit 635, a digital filter 636, a coarse/fine demultiplexer and register circuit 637, a digitally-controlled oscillator 638, a loop divider 639, and a frequency lock detector 640. In the diagram, leads labeled with the word "CONTROL" indicate that the values on these leads is under the control of processor 601 by writing to appropriate bits in control registers 613.

Figure 10:
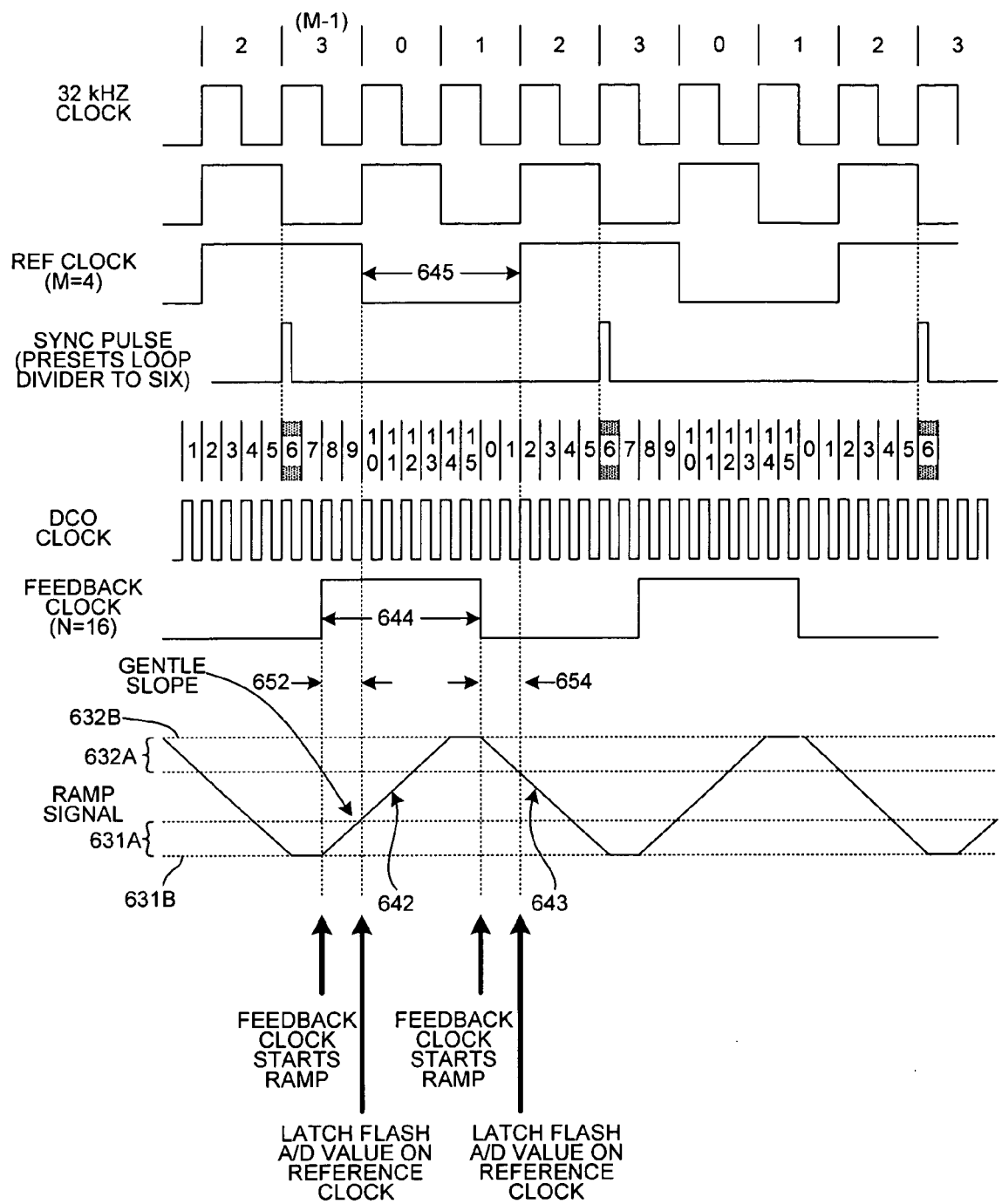
FIG. 10 is a waveform diagram illustrating an operation of the frequency locked loop of the example of FIG. 9.

Operation of frequency locked loop 609 of FIG. 9 is explained in connection with the waveform diagram of FIG. 10. In the example of FIG. 10, input multiplexer 627 is controlled such that a 32,768 hertz signal output by oscillator 607 is supplied to the input lead of reference divider 628. Reference divider 628 is set to divide by 4 (M=4). Reference divider therefore counts using the sequence 0, 1, 2, 3, 0, and so forth. The output of reference divider 628 is shown in the waveform labeled REF CLOCK.

Returning to FIG. 9, digitally controlled oscillator (DCO) 628 outputs an output clock signal onto conductor 618. This signal is represented in FIG. 10 by the waveform labeled "DCO CLOCK". Loop divider 639 divides this DCO clock signal by the integer N and outputs the resulting feedback clock signal onto conductor 641. Where N is sixteen, the feedback clock signal is represented in FIG. 10 by the waveform labeled FEEDBACK CLOCK (N=16).

This feedback clock signal is supplied to the input lead of ramp generator 629. The output of ramp generator 629 is represented in FIG. 10 by the waveform labeled "RAMP SIGNAL". Accordingly, the feedback clock signal going high causes ramp generator 629 to start outputting a first ramp 642. First ramp 642 is a rising ramp. The next falling edge of the feedback clock signal causes the ramp generator 629 to start outputting a second ramp 643. Ramp 643 is a falling ramp.

The output of ramp generator 629 is supplied to flash A/D converter 630. Flash A/D converter 630 may, for example, involve a multi-output tap resistor ladder and a corresponding comparator set. The eight-bit digital output of flash A/D converter 630 is supplied to the data inputs of registers 631 and 632.

As illustrated in the waveform diagram of FIG. 10, the falling edge of REF CLOCK causes the digital output of flash A/D 630 to be clocked into register 631. The value clocked into register 631 is indicative of the magnitude 631A of rising ramp 642 at the time of the falling edge of REF CLOCK. This magnitude is relative to baseline 631B.

Similarly, the next rising edge of REF CLOCK causes the digital output of flash A/D 630 to be clocked into register 632. The value clocked into register 632 is indicative of the magnitude 632A of falling ramp 643 at the time of the rising edge of REF CLOCK. This magnitude 632A is relative to baseline 632B.

The difference between the two digital values stored in registers 631 and 632 is indicative of the magnitude of the difference in frequency between the FEEDBACK CLOCK and the REF CLOCK. More particularly, it is indicative of the time difference between the period of time 644 that the feedback clock signal is high and the period of time 645 that the reference clock is low. Accordingly, the value in register 631 is converted into a base two number by block 633 and the result is supplied to subtractor 635. The value in register 632 is converted into a base two number by block 634 and the result in supplied to subtractor 635. Subtractor 635 outputs the difference between the two values and supplies this difference to digital filter 636. By subtracting the two difference values, instabilities from the effects of analog components in the ramp generator are canceled.

As operation of the circuit proceeds from clock cycle of REF CLOCK to clock cycle of REF CLOCK, a stream of digital values is output by subtractor 635. Digital filter 636 filters this stream and outputs a smoothed stream of values onto conductors 646. This smoothed stream of values passes through block 637 onto coarse control input leads 647 of DCO 638. DCO 638 has coarse control input leads 647 and fine control input leads 648. In this initial frequency locking process, block 637 outputs a fixed digital value onto fine control input leads 648.

The stream of smoothed digital values on coarse input leads 647 causes the frequency of the DCO CLOCK output signal to have a corresponding frequency. This DCO CLOCK output signal is supplied to loop divider 639 to complete the control loop. As operation of the feedback control loop proceeds from cycle to cycle of REF CLOCK, the control loop causes DCO 638 to be controlled such that digital output of subtractor 635 tends to the digital value zero. The FEEDBACK CLOCK clock signal output by loop divider 639 is therefore frequency locked with respect to the reference clock signal REF CLOCK output by reference divider 628.

The feedback clock signal FEEDBACK CLOCK is synchronized with respect to the reference clock REF CLOCK at the beginning of each period of REF CLOCK by a synchronization signal supplied via conductor 649 from reference divider 628 to the preset input lead 650 of loop divider 639. In the specific example of FIG. 9, the synchronization signal is generated by a rising edge detector. The rising edge detector outputs a pulse at the beginning of the terminal count period of reference divider 628. Where M is four as shown in FIG. 10, the terminal count value is three. This synchronization pulse is illustrated in FIG. 10 by the waveform labeled SYNC PULSE. This synchronization pulse is supplied to preset input lead 650 of loop divider 639 such that loop divider is preset to a preset value present on its preset value input leads 651. In the example of FIG. 10, the preset value is a digital six. Loop divider 639 therefore counts from the preset value of six, to seven, to eight. When the loop divider 639 transitions to the count state eight, the feedback clock FEEDBACK CLOCK transitions high as illustrated in FIG. 10. Loop divider 639 continues to count until the count state rolls over from the terminal count of sixteen to the count value zero. Upon entering count state zero, the feedback clock FEEDBACK CLOCK transitions low as illustrated in FIG. 10. Because the synchronization pulse is generated from the reference clock, changing the preset value to which the loop divider is preset can change the time 652 (see FIG. 10) between the rising edge of the feedback clock and the falling edge of the reference clock.

The slope of the rising ramp and the slope of the falling ramp of the ramp signal can be changed. The slope is determined by a digital value SLOPE VALUE present on conductor 653. Initially in the frequency locking process, a more gentle slope is used. Then once operation of the control loop causes the output of subtractor 635 to approach a digital zero, the slope of the ramp signal is changed to a steeper slope. The frequency locking process is continued until the control loop again causes the output of subtractor 635 to approach zero.

It is desired that the ramp signal have a magnitude that is neither too small nor too large at the time that the output of the flash A/D converter is to be captured. If the slope of the rising ramp is too steep and time duration 652 is too long, then the magnitude of the rising ramp may reach upper rail baseline voltage 632B. This is undesirable. Similarly, if the slope of the rising ramp is too gentle and if time duration 652 is too short, then the magnitude of the rising ramp signal may not have changed from its initial baseline value 631B. This is undesirable. Accordingly, time duration 652 is decreased as the slope of the ramp signal is increased such that the magnitudes of the values latched into registers 631 and 631 are not at either one of baseline voltages 631B or 632B. Accordingly, there is a correspondence between the SLOPE VALUE supplied to ramp generator 629 and the PRESET VALUE supplied to loop divider 639.

The SLOPE VALUE and PRESET VALUE are supplied by a lookup table block 655 within frequency lock detector 640. If the input value supplied to lookup table 655 is within a first predetermined range, then lookup table 655 outputs a first set of preset and slope values. If the input value supplied to lookup table 655 is within a second predetermined range, then lookup table 655 outputs a second set of preset and slope values. In this way, lookup table 655 can have two or more such predetermined ranges. In one embodiment, the different ranges of the input values are of different sizes. In another embodiment, all the ranges of the input values are of the same size.

In addition to lookup table 655, the frequency lock detector 640 includes a high pass filter 656, a low pass filter 657, and an absolute value generator 658.

Figure 11A:
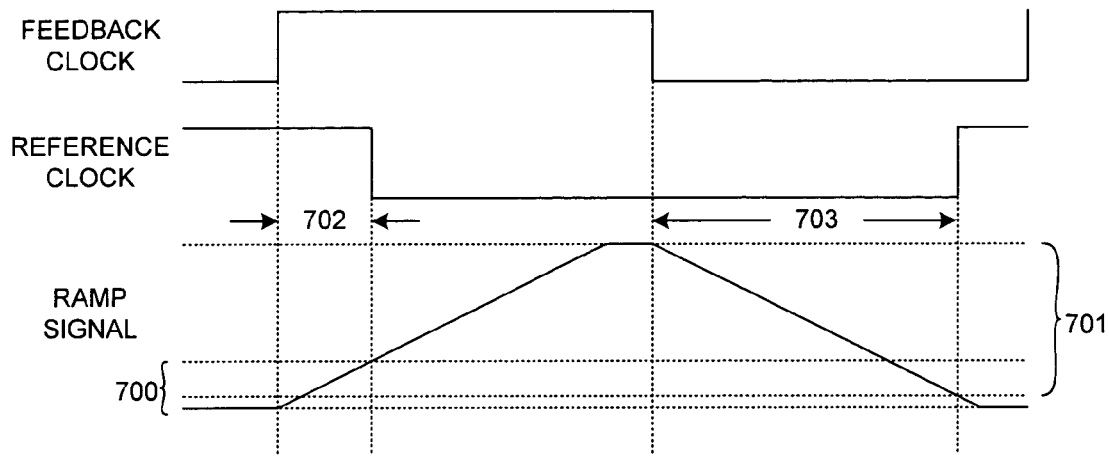
FIGS. 11A–11C are waveform diagrams illustrating how the slope of the ramp signal is changed as the frequency locked loop of FIG. 9 frequency locks.
Figure 11B:
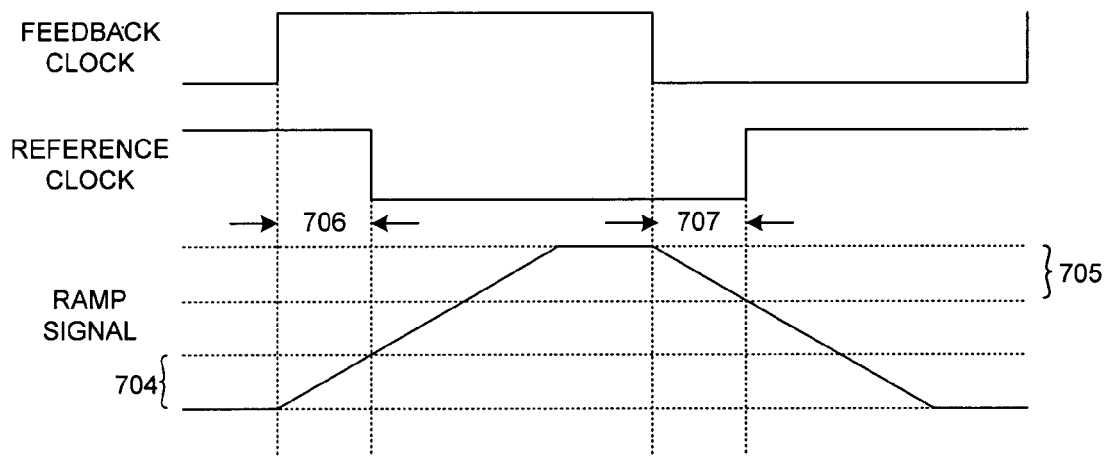
Figure 11C:
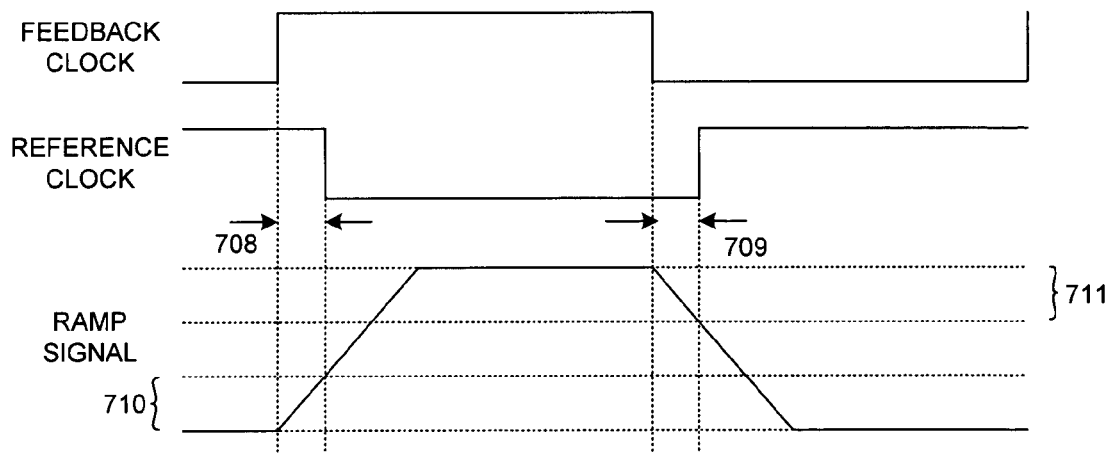

FIGS. 11A–11C illustrate a frequency locking process involving changing the slope of the ramp signal. FIG. 11A illustrates an initial cycle involving a gentle slope. As illustrated, the period of the reference clock is considerably greater than the period of the feedback clock. The magnitude 700 of the rising ramp captured into register 631 is therefore considerably smaller than the magnitude 701 of the falling ramp captured into register 632. Time duration 702 differs considerably from time duration 703.

FIG. 11B illustrates a later cycle wherein operation of the control loop has increased the frequency of the feedback clock (the diagram is normalized with respect to the feedback clock). The period of the feedback clock is roughly the same as the period of the reference clock. The magnitude 704 of the rising ramp captured into register 631 is therefore almost the same as the magnitude 705 of the falling ramp captured into register 632. Time durations 706 and 707 are similarly almost the same.

FIG. 11C illustrates a later cycle in the frequency locking process. The stream of values output by digital filter 636 is such that the frequency lock detector 640 detects a near lock condition. Slope and preset value lookup table 655 is therefore controlled to change SLOPE VALUE to increase the slope of the ramp signal output by ramp generator 629. To avoid the output of the flash A/D converter 630 railing to a baseline voltage, the time periods 708 and 709 are shortened by changing the preset value as set forth above. Frequency locking proceeds using this greater slope of ramp signal proceeds until the magnitude 710 of the rising ramp captured into register 631 is the same as the magnitude 711 of the falling ramp captured into register as filtered by digital filter 636. When a stable state is detected as determined by frequency lock detector 640 using the steepest slope, then frequency lock detector 640 outputs a digital high signal FREQUENCY LOCK.

In one embodiment, the frequency lock signal FREQUENCY LOCK is supplied to the coarse/fine demux/register block 637 to latch the current feedback value on the coarse DCO input leads and to switch the control loop value so that the control loops changes the DCO output frequency using the fine DCO input leads. The frequency lock occurs using the coarse DCO control input leads, and then once frequency lock is achieved the DCO is controlled using the find DCO control input leads.

In another embodiment, another control signal (not shown) is supplied by frequency lock detector block 640 to coarse/fine demux/register block 637 to determine whether the coarse DCO input leads are used in the feedback control loop or whether the fine DCO input leads are used in the feedback control loop. In such an embodiment, for each slope value, the coarse DCO input leads are used in the initial part of the process when the values latched into registers 631 and 632 are considerably different, and then the fine DCO input leads are used in the later part of the process when the values latched into registers 631 and 632 become closer to one another within a predetermined threshold amount. Locking proceeds in this way using ever steeper ramp slope values until the steepest ramp is used. Rather than the frequency lock signal FREQUENCY LOCK being supplied to block 637 as illustrated in FIG. 9, the frequency lock signal FREQUENCY LOCK is an output of frequency locked loop 609. This FREQUENCY LOCK output can be read by processor 609. The FREQUENCY LOCK signal transitions high at the end of the entire frequency locking process when the loop is frequency locked using the highest ramp slope.

Figure 12:
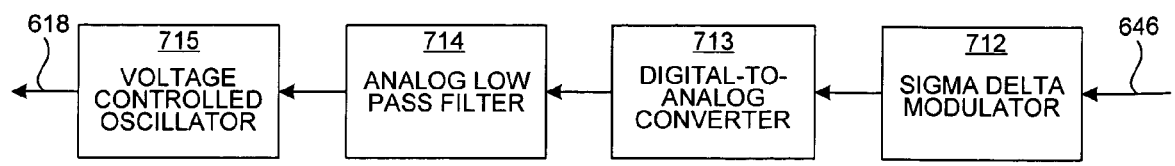
FIG. 12 is a diagram of circuitry that can replace blocks of 637 and 638 of FIG. 9 in accordance with another embodiment.

The particulars of the frequency locked loop of FIG. 9 are provided for illustrative purposes. Other frequency locked loop structures are known in the art and can be employed in microcontroller 600. Parts of the frequency locked loop circuitry of FIG. 9 can be replaced with other circuitry as well. For example, FIG. 12 illustrates circuitry that can be used in place of the coarse/fine demux/register block 637 and digitally controlled oscillator (DCO) block 638 of the embodiment of FIG. 9. Namely, blocks 637 and 638 of the circuit of FIG. 9 are replaced with a sigma delta modulator 712, digital-to-analog converter 713, low pass filter 714 and voltage controlled oscillator 715 as illustrated in FIG. 12.

Whilst the invention has been described above by reference to various embodiments, it will be understood that changes and modifications may be made without departing from the scope of the invention, which is to be defined only by the appended claims and their equivalent. In addition to frequency locking, the clock multiplication circuit can involve phase locking. Block 609 of the embodiment of FIG. 8 is therefore a phase-locked loop in one embodiment. The phase-locked loop can be an all digital phase locked loop, or alternatively can be an analog phase locked loop, the loop filter of which is replaced with a digital filter. The on-board crystal oscillator circuit can be driven by a low frequency external oscillator rather than the on-board crystal oscillator circuit being coupled to a low frequency external crystal. The function of the ramp generator can be provided by two separate ramp generators, one for the leading edges time differences and the other for the trailing edges time differences. Various other parts of the circuitry can be embodied with different topology, as is apparent to one of ordinary skill in the art. Such and other variations are within the scope of the invention. Accordingly, various modifications, adaptations, and combinations of various features of the described embodiments can be practiced without departing from the scope of the invention as set forth in the claims.

What is claimed is:

1. A microcontroller integrated circuit, comprising:
   a terminal;
   a crystal oscillator circuit coupled to the terminal, the crystal oscillator circuit outputting a first clock signal of a first frequency;
   a real time clock that receives the first clock signal;
   a processor having a clock input lead; and
   a clock multiplier circuit having an input lead and an output lead, the clock multiplier circuit receiving the first clock signal from the crystal oscillator circuit and generating therefrom a second clock signal, the second clock signal having a second frequency that is a multiple of the first frequency, wherein the second clock signal is supplied to the clock input lead of the processor, wherein the clock multiplier circuit includes a frequency locked loop, the frequency locked loop including a digital filter, wherein the frequency locked loop frequency locks a first signal with respect to a second signal, the frequency locked loop further including a ramp generator, wherein the ramp generator starts a first ramp upon a first edge of the first signal, and wherein a first digital value indicative of a magnitude of the first ramp is determined upon a first edge of the second signal, and wherein the ramp generator starts a second ramp upon a second edge of the first signal, and wherein a second digital value indicative of a magnitude of the second ramp is determined upon a second edge of the second signal, the first and second digital values being used to generate a third digital value, the third digital value being supplied to the digital filter.

2. The microcontroller of claim 1, wherein the first frequency is 32,768 hertz or 32,768 hertz divided by an integer, and wherein the second frequency is greater than 32,768 hertz.

3. The microcontroller of claim 1, wherein the multiple can be changed by the processor.

4. The microcontroller of claim 1, wherein the multiple is an integer that can be changed by the processor.

5. The microcontroller of claim 1, further comprising:
   a second terminal, wherein the second clock signal of the second frequency can be output onto the second terminal.

6. The microcontroller of claim 1, wherein the ramp generator receives a slope control input signal, the slope control input signal at least in part determining a slope of the first ramp and a slope of the second ramp.

7. The microcontroller of claim 6, wherein the slope control input signal is changed during a frequency locking process wherein the first signal is locked with respect to the second signal.

8. The microcontroller of claim 7, wherein the slope control input signal is a multi-bit digital signal.

9. A microcontroller integrated circuit, comprising:
   a terminal;
   a crystal oscillator circuit coupled to the terminal, the crystal oscillator circuit outputting a first clock signal of a first frequency;
   a real time clock that receives the first clock signal;
   a processor having a clock input lead; and
   a clock multiplier circuit having an input lead and an output lead, the clock multiplier circuit receiving the first clock signal from the crystal oscillator circuit and generating therefrom a second clock signal, the second clock signal having a second frequency that is a multiple of the first frequency, wherein the second clock signal is supplied to the clock input lead of the processor, wherein the clock multiplier circuit includes a control loop, the control loop including an oscillator and a loop divider, the loop divider being a counter that is preset with a preset value, and wherein a phase of the second signal is adjusted with respect to the first signal by changing the preset value.

10. The microcontroller of claim 9, wherein the microcontroller is part of a battery-powered device, wherein the first frequency is less than 5 megahertz, and wherein the second frequency is greater than 100 megahertz.

11. The microcontroller of claim 9, further comprising:
    a second terminal, wherein a third clock signal on the second terminal can be supplied to the clock input lead of the clock multiplier circuit rather than the first clock signal, and such that the second clock signal output by the clock multiplier circuit is frequency locked to the third clock signal and not to the first signal, and wherein which of the first clock signal and the second clock signal is supplied to the input lead of the clock multiplier circuit can be changed by the processor.

12. The microcontroller of claim 9, wherein the terminal is coupled to a 32,768-hertz crystal external to the microcontroller integrated circuit.

13. The microcontroller of claim 9, wherein the control loop further includes a digital filter.

* * * * *